US009165936B2

(12) United States Patent
Ponoth et al.

(10) Patent No.: US 9,165,936 B2
(45) Date of Patent: Oct. 20, 2015

(54) DUMMY END-GATE BASED ANTI-FUSE DEVICE FOR FINFET TECHNOLOGIES

(71) Applicant: BROADCOM CORPORATION, Irvine, CA (US)

(72) Inventors: Shom Surendran Ponoth, Los Angeles, CA (US); Akira Ito, Irvine, CA (US); Changyok Park, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/173,744

(22) Filed: Feb. 5, 2014

(65) Prior Publication Data

US 2015/0200196 A1    Jul. 16, 2015

Related U.S. Application Data

(60) Provisional application No. 61/927,437, filed on Jan. 14, 2014.

(51) Int. Cl.
*H01L 29/00* (2006.01)
*H01L 27/112* (2006.01)
*H01L 29/78* (2006.01)
*H01L 29/66* (2006.01)
*H01L 23/525* (2006.01)

(52) U.S. Cl.
CPC ...... *H01L 27/11206* (2013.01); *H01L 23/5252* (2013.01); *H01L 29/66545* (2013.01); *H01L 29/66795* (2013.01); *H01L 29/7851* (2013.01)

(58) Field of Classification Search
CPC .............. H01L 23/5252; H01L 2924/3011; H01L 21/6888; H01L 27/112
USPC .................. 257/209, 530; 438/131
See application file for complete search history.

(56) References Cited

U.S. PATENT DOCUMENTS

| 8,969,999 B2 * | 3/2015 | Liang et al. ............ 257/529 |
| 2004/0021199 A1 | 2/2004 | Trivedi |
| 2006/0128071 A1 | 6/2006 | Rankin et al. |
| 2011/0031582 A1 | 2/2011 | Booth, Jr. et al. |
| 2013/0193526 A1 | 8/2013 | Lo et al. |
| 2015/0123209 A1 | 5/2015 | Choi et al. |

FOREIGN PATENT DOCUMENTS

JP    2008-311409 A    12/2008

* cited by examiner

*Primary Examiner* — Quoc Hoang
(74) *Attorney, Agent, or Firm* — McDermott Will & Emery LLP

(57) ABSTRACT

An anti-fuse device for fin field-effect transistor (finFET) technology includes a dummy gate, an electrically conductive contact, and a diffusion contact. The dummy gate is formed over an end-corner of a fin. The electrically conductive contact is disposed on a portion of the dummy gate and can be used as a first electrode of the device. The diffusion contact is disposed over the fin and can be used as a second electrode of the device.

20 Claims, 6 Drawing Sheets

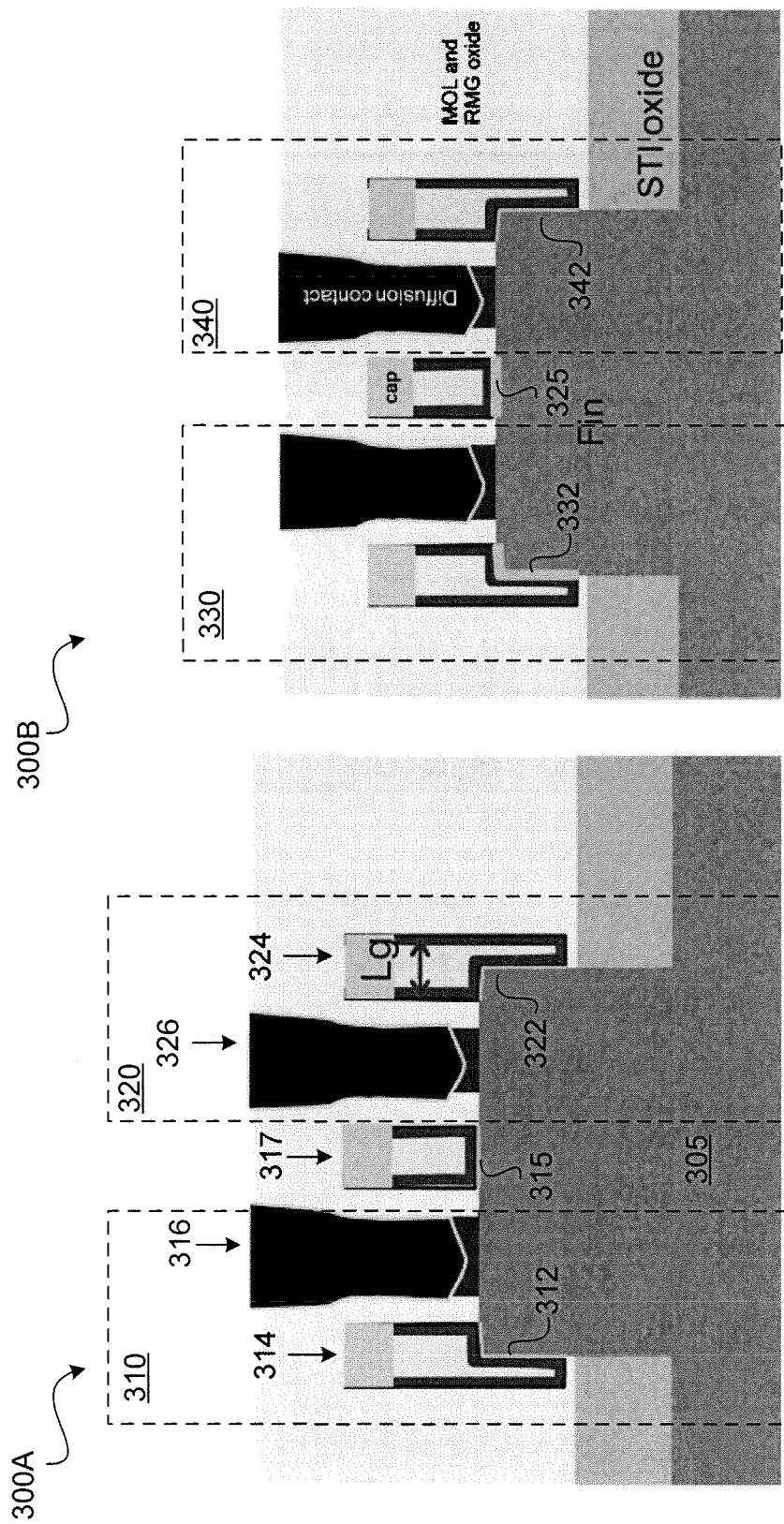

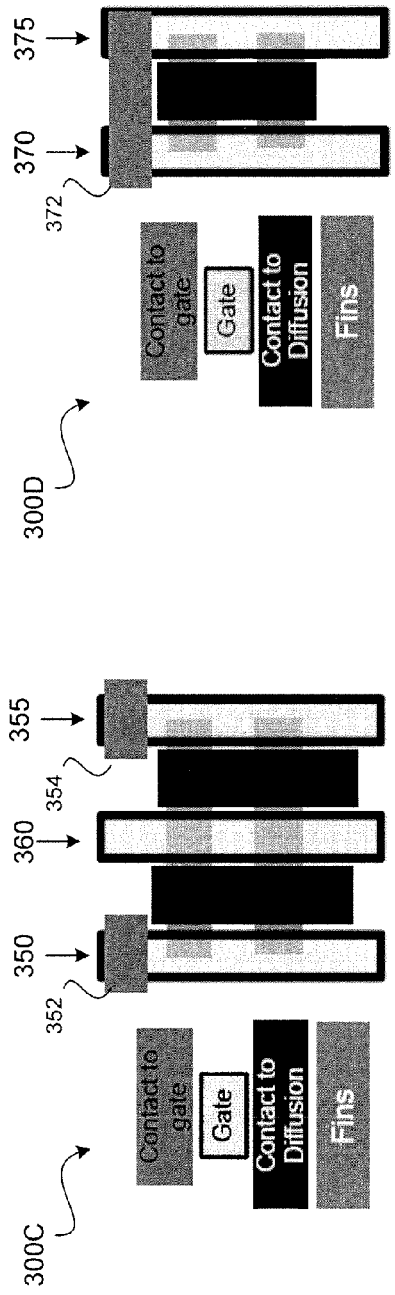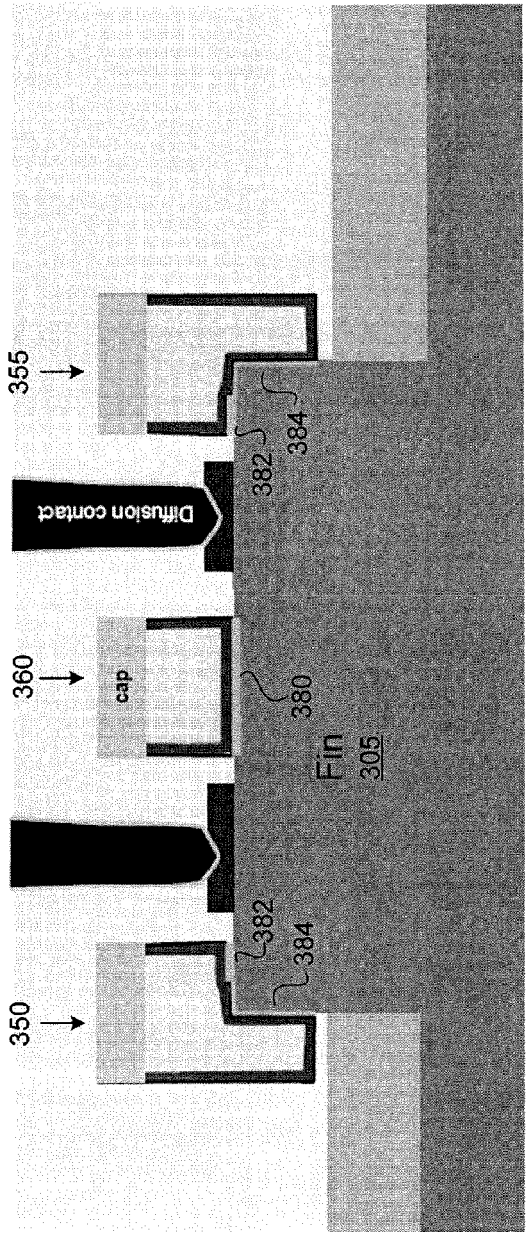

DUMMY END-GATE BASED ANTI-FUSE DEVICE FOR FINFET TECHNOLOGIES

CROSS-REFERENCE TO RELATED APPLICATIONS

This application claims the benefit of priority under 35 U.S.C. §119 from U.S. Provisional Patent Application No. 61/927,437 filed Jan. 14, 2014, which is incorporated herein by reference in its entirety.

TECHNICAL FIELD

The present description relates generally to memory devices, and more particularly, but not exclusively, to a dummy end-gate based anti-fuse device for finFET technologies.

BACKGROUND

In one-time programmable (OTP) memory, which is a form of digital memory, the setting memory bits may be locked by using a fuse or an anti-fuse for each bit. Most OTP memories may require a programmable fuse element along with a select device (e.g., a switch). Anti-fuse cells may be implemented based on oxide breakdown, where a layer (e.g., a thin layer) of silicon oxide (SiO2) located between a gate terminal and a channel of a transistor (e.g., MOS transistor) may experience breakdown. The breakdown process can happen in a defective transistor, although in normal transistors, high temperature and/or high voltage can cause breakdown of the oxide layer. The oxide breakdown can also be utilized in a positive manner in non-volatile memory (NVM), as a memory cell can be programmed by trapping charges in an isolated location to be applied to break the oxide (only one time) at a program area.

An anti-fuse cell may also be implemented by using a thin silicon layer between two metal layers (e.g., metal tracks) as an insulator, which can upon applying a pulse of relatively high voltage and current be converted to a conducting poly-silicon. The poly-silicon that is grown on the spot can work as a link between the two metal layers. Further, the anti-fuse cells can be realized by using thick or split-oxide layers. The thin-oxide anti-fuse cells typically need a select device for proper operation, therefore, cannot be used in cross-point diode array configurations, as it can form an ohmic contact directly to the source instead of forming a diode connected transistor.

BRIEF DESCRIPTION OF THE DRAWINGS

Certain features of the subject technology are set forth in the appended claims. However, for purpose of explanation, several embodiments of the subject technology are set forth in the following figures.

FIGS. 3A-3E illustrate example realization of the anti-fuse device of FIG. 1 in accordance with one or more implementations.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides a device and implementation for providing an end-gate based anti-fuse device for fin field-effect transistor (finFET) technology. Implementation of the existing gate-oxide OTP devices in finFET technology is challenging due to lower breakdown field for junctions, which can result in breakdown of the junction earlier than the gate oxide. The subject technology provides a number of advantageous features including programmability at low voltage, chip area saving, and compatibility with standard fabrication flows. The programmability at low voltage is due to field enhancement at the edge of the fin corners. Chip area saving is achieved because the already present dummy gates are leveraged to form the anti-fuse device. The compatibility with standard fabrication flows of the subject technology is due to the fact that no additional masks are needed to realize the anti-fuse cells, thus the disclosed anti-fuse device can be fabricated on a finFET chip at no additional cost.

Figure 1:
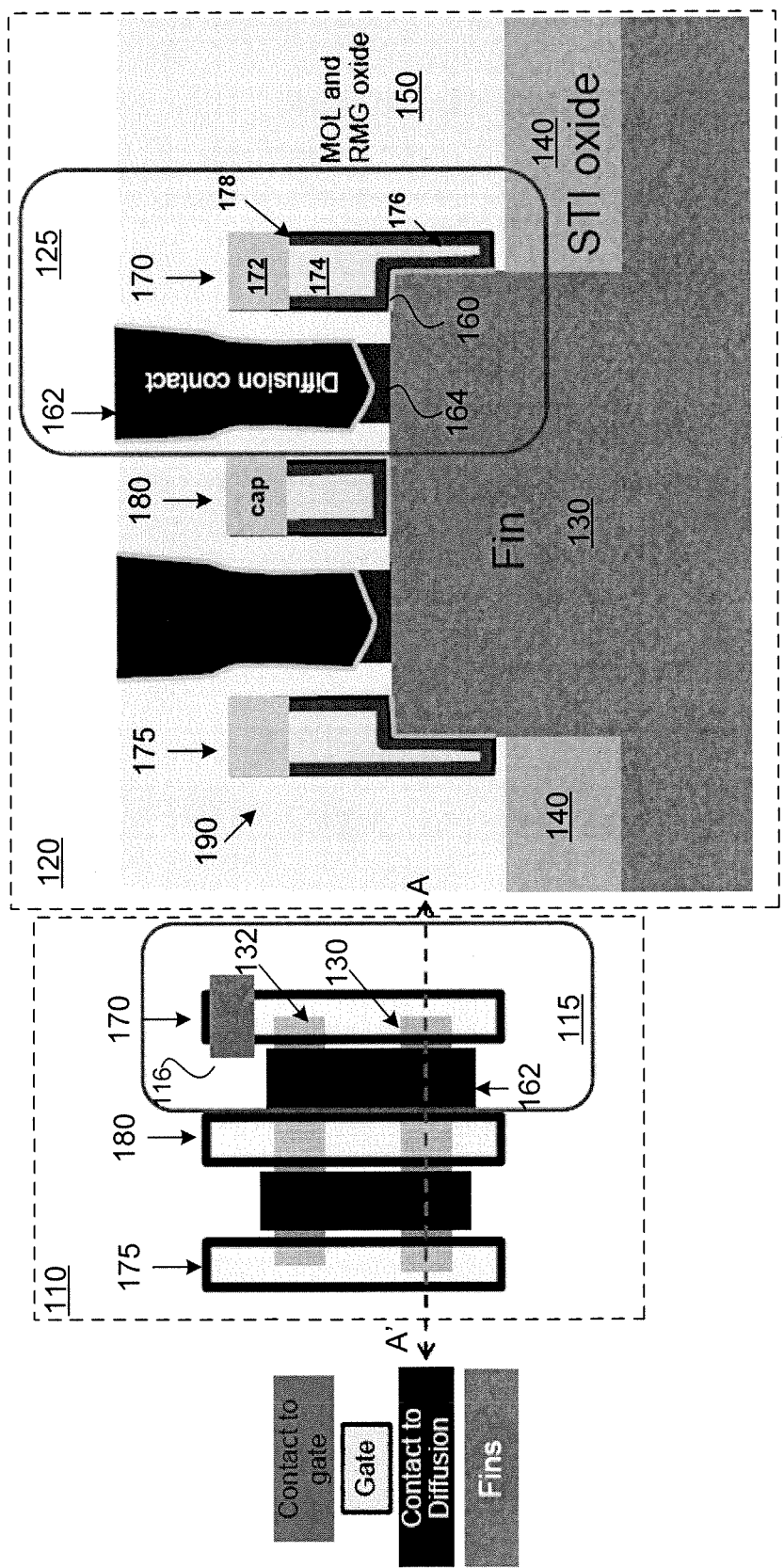
FIG. 1 illustrates a top view and a side view of a fin field-effect transistor (finFET) including an example of an anti-fuse device in accordance with one or more implementations in accordance with one or more implementations.

FIG. 1 illustrates a top view 110 and a side view 120 of a fin field-effect transistor (finFET) including an example of an anti-fuse device in accordance with one or more implementations of the subject technology. The top view 110 of the finFET shows a top view 115 of the anti-fuse device, which includes a dummy gate 170, a diffusion contact 162, and an electrically conductive contact 116 (e.g., a metal contact made of a metal such as tungsten, aluminum, etc.). The dummy gate 170 is formed over an end-corner of fins 130 and/or 132, and the electrically conductive contact 116 is disposed on a portion of the dummy gate 170. The electrically conductive contact 116 can be used as a first electrode (e.g., anode or cathode) of the anti-fuse device and the diffusion contact 162 can be used as a second electrode (e.g., cathode or anode) of the anti-fuse device. The dummy gate 170 partially extends out of the end-corner of the fins 130 and/or 132.

In one or more implementations, the fins 130 and 132 are the fins of the already existing finFET, which includes the gate 180 and another dummy gate 175. The dummy gates 170 and 175 are formed on many finFET devices for fabrication process reasons and are normally inactive. The subject technology can advantageously leverage the existing dummy gates 170 and/or 175 and the diffusion contact 162 (e.g., a source or a drain contact of the finFET device) with the addition of the conductive contact 116 to form the anti-fuse device that can be programmed as described in more details herein. It is understood that the addition of the conductive contact 116 does not require any extra mask, thus can be realized with no added cost.

The side view 120 is a cross-sectional view arcos the line AA' that shows the fin 130, over which the dummy gates 170 and 175 and the diffusion contact 170 are formed. A shallow-trench isolation (STI) oxide layer 140, an oxide 150 (e.g., including middle-of-the-line (MOL) and replacement-metal-gate (RMG) oxide), and spacers 190 are formed as parts of standard finFET technology fabrication process. In one or more implementations, the dummy gates 170 and 175 are isolated from the fin 130 by a thin oxide layer 160 (e.g., a grown silicon dioxide layer). In some aspects, the thin oxide layer 160 is formed such at it can breakdown in at least one point (e.g., near the end-corner) when a suitable voltage is applied between the first and the second electrodes of the anti-fuse device to program the device.

The diffusion contact 162 can be formed on an epitaxial layer 164 formed on the fin 130. The gate 180 is part of the finFET device and is not needed for the operation of the anti-fuse device. The dummy gates 170 and 175 are structurally similar to the gate 180 and include a high-k dielectric layer 178, work-function metal layer 176, and a metal 174 (e.g., aluminum, tungsten, etc.). The work-function metal layer 176 can be used to make adjustments to the threshold voltage of the transistor. The cap 172 can be formed by a silicon-nitride or a dielectric other than silicon oxide. The gate contact 116 is etched through the cap layer to be electrically coupled to the metal 174 so that the dummy gate can be wired out to be used as an electrode of the anti-fuse device.

Figure 2:
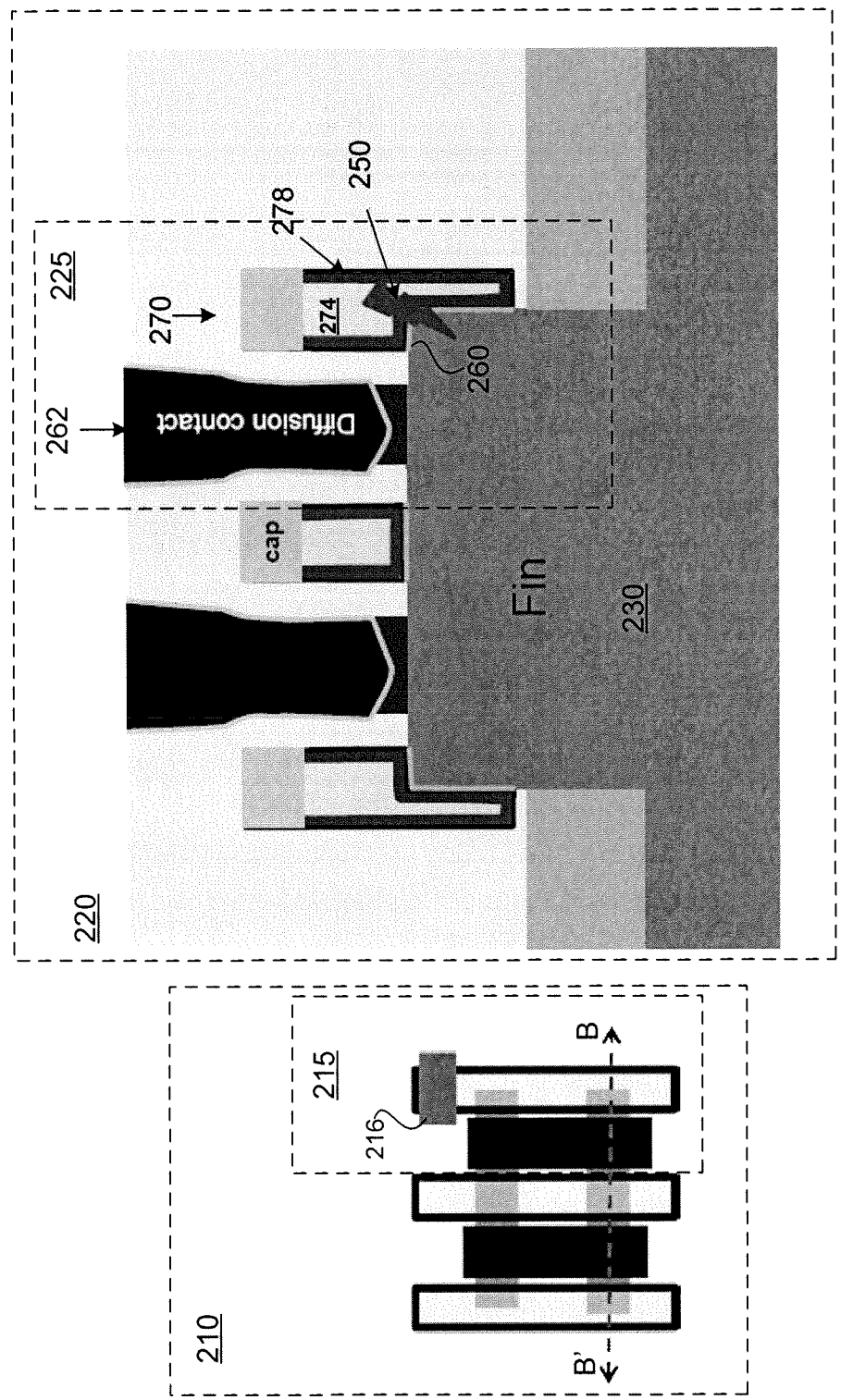
FIG. 2 illustrates programming of the example anti-fuse device of FIG. 1 in accordance with one or more implementations.

FIG. 2 illustrates programming of the example anti-fuse device of FIG. 1 in accordance with one or more implementations of the subject technology. The anti-fuse device is structurally similar to the anti-fuse device of FIG. 1, and is shown by the top view 215 and the side view 225 as part of a top view 210 and a side view 220 of a finFET device. The side view 225 is a cross-sectional view across BB'. The anti-fuse device can be used as a one-time-programmable (OTP) device to store a bit of information (e.g., 0 or 1) after being programmed. The anti-fuse device can be programmed by applying a high-voltage (e.g., more than 0.9V for 16 nm finFET technology) between the metal 274 of the dummy gate 270, which is electrically coupled (e.g., wired) to the metal contact 216, and the diffusion contact 262. The applied high voltage can breakdown (e.g., show by breakdown symbol 250) the thin oxide layer 260 and the high-k layer 278 to provide a current path between the metal contact 216 and the diffusion contact 262. The breakdown has a higher chance of occurring near the corner of the fin 230, as the electric field is understood to be enhanced at the corners. The enhancement of the electric filed at the corners allow for a lower breakdown voltage for the anti-fuse device of the subject technology.

FIGS. 3A-3E illustrate example realizations of the anti-fuse device of FIG. 1 in accordance with one or more implementations of the subject technology. In one or more implementations, a realization 300A shown in FIG. 3A, includes two anti-fuse devices 310 and 320 that are formed by the dummy gates 314 and 324 and diffusion contacts 316 and 326, respectively. For both anti-fuse devices 310 and 320, the oxide layers 312 and 322 are thin oxide layers (e.g., approximately 0.5 nm) and have the same thickness as the oxide layer 315 of the gate 317. The width Lg of the dummy gates can be varied (e.g., between 10-200 nm) for different dummy gates (e.g., 314 and 324). The dummy gates 314 and 324 are formed such that they cover the corners of the fin 305.

In one or more implementations, a realization 300B shown in FIG. 3B, includes two anti-fuse devices 330 and 340 that are similar to the anti-fuse devices 310 and 320, except that oxide layers (e.g., 332 and 342) have different thicknesses (e.g., 322 is a thick oxide, with a thickness of approximately 2-4 nm, and 342 is a thin oxide with a thickness of approximately 0.5 nm), whereas the oxide layer 325 of the gate is a thick oxide. In some aspects, the thin oxide layer and the thick oxide layer can be formed by silicon dioxide.

In some implementations, a realization 300C shown in FIG. 3C, includes two anti-fuse devices that can use two dummy gates 355 and 350 with corresponding metal contacts 352 and 354. The dummy gates 355 and 350 are formed over end-corners of the same fins as used by a finFET transistor using the gate 360. In one or more implementations, a realization 300D shown in FIG. 3D, includes an OTP device that is formed, for example, by two dummy gates 370 and 375 sharing a metal contact 372, without any finFET transistor or a corresponding gate for the finFET transistor being formed.

Finally, in some implementations, such as a realization 300E of FIG. 3E, one or both of the dummy gates 350 and 355 are isolated from the fin 305 by a split-oxide layer formed by a thick portion 382 and a thin portion 384, whereas the gate 360 of the finFET device is formed using a thick oxide layer 380. The thin oxide layer 384 and the thick oxide layers 380 and 382 can be formed by silicon dioxide.

Figure 4:
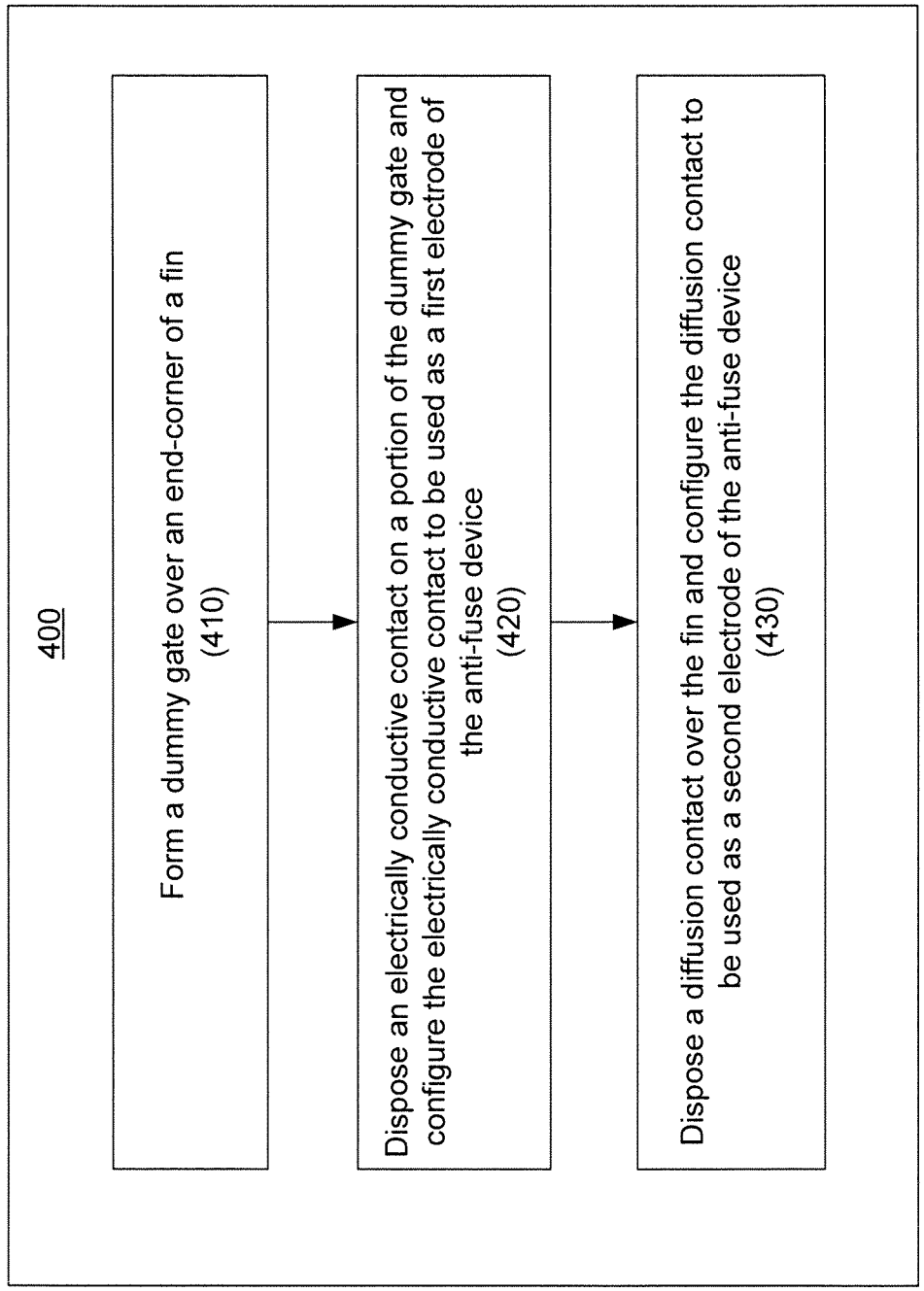
FIG. 4 illustrates an example of a method for proving an anti-fuse device for finFET technology in accordance with one or more implementations.

FIG. 4 illustrates an example of a method 400 for proving an anti-fuse device for finFET technology in accordance with one or more implementations of the subject technology. For explanatory purposes, the example method 400 is described herein with reference to, but is not limited to, the top view 115 and the side view 125 of the anti-fuse device of FIG. 1A. Further for explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

The method 400 includes forming a dummy gate (e.g., 170 of FIG. 1) over an end-corner of a fin (e.g., 130 of FIG. 1) (410). An electrically conductive contact (e.g., 116 of FIG. 1) is disposed on a portion of the dummy gate to be used as a first electrode of the anti-fuse device (e.g., shown in 115 and 125 of FIG. 1) (420). A diffusion contact (e.g., 162 of FIG. 1) is disposed over the fin and is used as a second electrode of the anti-fuse device (430).

Figure 5:
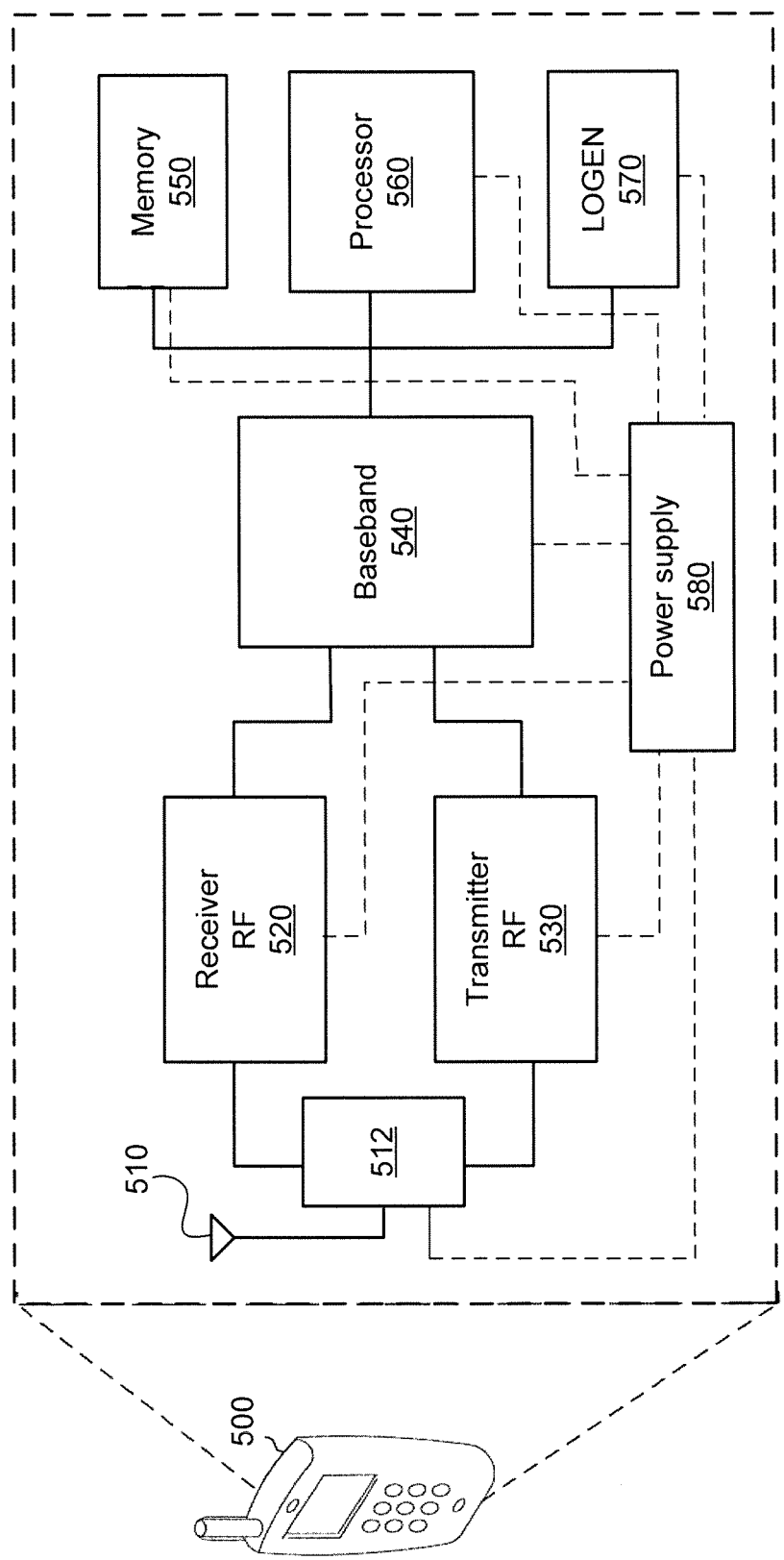
FIG. 5 illustrates an example of a wireless communication device in accordance with one or more implementations.

FIG. 5 illustrates an example of a wireless communication device 500 in accordance with one or more implementations of the subject technology. The wireless communication device 500 can comprise a radio-frequency (RF) antenna 510, a receiver 520, a transmitter 530, a baseband processing module 540, a memory 550, a processor 560, a local oscillator generator (LOGEN) 570, and a power supply 580. In various embodiments of the subject technology, one or more of the blocks represented in FIG. 5 can be integrated on one or more semiconductor substrates. For example, the blocks 520-570 can be realized in a single chip or a single system on chip, or can be realized in a multi-chip chipset.

The RF antenna 510 can be suitable for transmitting and/or receiving RF signals (e.g., wireless signals) over a wide range of frequencies. Although a single RF antenna 510 is illustrated, the subject technology is not so limited.

The receiver 520 comprises suitable logic circuitry and/or code that can be operable to receive and process signals from the RF antenna 510. The receiver 520 may, for example, be operable to amplify and/or down-covert received wireless signals. In various embodiments of the subject technology, the receiver 520 is operable to cancel noise in received signals and can be linear over a wide range of frequencies. In this manner, the receiver 520 is suitable for receiving signals in accordance with a variety of wireless standards. Wi-Fi, WiMAX, Bluetooth, and various cellular standards.

The transmitter 530 comprises suitable logic circuitry and/or code that can be operable to process and transmit signals from the RF antenna 510. The transmitter 530 may, for example, be operable to up-covert baseband signals to RF signals and amplify RF signals. In various embodiments of the subject technology, the transmitter 530 is operable to up-convert and amplify baseband signals processed in accordance with a variety of wireless standards. Examples of such standards include Wi-Fi, WiMAX, Bluetooth, and various cellular standards. In various embodiments of the subject technology, the transmitter 530 is operable to provide signals for further amplification by one or more power amplifiers.

The duplexer 512 provides isolation in the transmit band to avoid saturation of the receiver 520 or damaging parts of the receiver 520, and to relax one or more design requirements of the receiver 520. Furthermore, the duplexer 512 can attenuate the noise in the receive band. The duplexer is operable in multiple frequency bands of various wireless standards.

The baseband processing module 540 comprises suitable logic, circuitry, interfaces, and/or code that can be operable to perform processing of baseband signals. The baseband processing module 540 may, for example, analyze received signals and generate control and/or feedback signals for configuring various components of the wireless communication device 500 such as the receiver 520. The baseband processing module 540 is operable to encode, decode, transcode, modulate, demodulate, encrypt, decrypt, scramble, descramble, and/or otherwise process data in accordance with one or more wireless standards.

The processor 560 comprises suitable logic, circuitry, and/or code that can enable processing data and/or controlling operations of the wireless communication device 500. In this regard, the processor 560 is enabled to provide control signals to various other portions of the wireless communication device 500. The processor 560 can also control transfers of data between various portions of the wireless communication device 500. Additionally, the processor 560 can enable implementation of an operating system or otherwise execute code to manage operations of the wireless communication device 500.

The memory 550 comprises suitable logic, circuitry, and/or code that can enable storage of various types of information such as received data, generated data, code, and/or configuration information. The memory 550 comprises, for example, RAM (e.g. SRAM), ROM, flash, and/or magnetic storage. In various embodiment of the subject technology, Information stored in the memory 550 can be utilized for configuring the receiver 520 and/or the baseband processing module 540. The ROM can include OTP memory cells formed by anti-fuse devices of the subject technology, such as the anti-fuse device shown in 115 and 125 of FIG. 1. The anti-fuse devices of the subject technology can be formed using the finFET technology at almost no additional cost. The anti-fuse device of the subject technology provides a number of advantageous features including programmability at low voltage, chip area saving, and compatibility with standard fabrication flow.

The local oscillator generator (LOG EN) 570 comprises suitable logic, circuitry, interfaces, and/or code that can be operable to generate one or more oscillating signals of one or more frequencies. The LOGEN 570 can be operable to generate digital and/or analog signals. In this manner, the LOGEN 570 can be operable to generate one or more clock signals and/or sinusoidal signals. Characteristics of the oscillating signals such as the frequency and duty cycle can be determined based on one or more control signals from, for example, the processor 560 and/or the baseband processing module 540.

In operation, the processor 560 can configure the various components of the wireless communication device 500 based on a wireless standard according to which it is desired to receive signals. Wireless signals can be received via the RF antenna 510 and amplified and down-converted by the receiver 520. The baseband processing module 540 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 550, and/or information affecting and/or enabling operation of the wireless communication device 500. The baseband processing module 540 can modulate, encode and perform other processing on audio, video, and/or control signals to be transmitted by the transmitter 530 in accordance to various wireless standards. The power supply 580 can provide one or more regulated rail voltages (e.g., $V_{DD}$) for various circuitries of the wireless communication device 500.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An anti-fuse device for fin field-effect transistor (finFET) technology, the device comprising:
    a dummy gate formed over an end-corner of a fin;
    an electrically conductive contact disposed on a portion of the dummy gate and configured to be used as a first electrode of the device; and
    a diffusion contact disposed over the fin and configured to be used as a second electrode of the device.

2. The device of claim 1, wherein the dummy gate partially extends out of the end-corner of the fin, and wherein the fin comprises a fin of an already existing finFET.

3. The device of claim 1, wherein the dummy gate is isolated from the fin by a thin oxide layer, wherein the thin oxide layer comprises silicon dioxide.

4. The device of claim 3, wherein the thin oxide layer is configured to breakdown in at least one point near the end-corner when a suitable voltage is applied between the first and the second electrodes of the device to program the device.

5. The device of claim 1, wherein the diffusion contact is formed on an epitaxial layer formed on the fin.

6. The device of claim 1, wherein the dummy gate is isolated from the fin by a thick oxide layer, wherein the thick oxide layer comprises silicon dioxide.

7. The device of claim 1, wherein two dummy gates are formed over end-corners of the fin, and wherein a first one of the two dummy gates is isolated from the fin by a thin oxide layer and the second one of the two dummy gates is isolated from the fin by a thick oxide layer.

8. The device of claim 7, wherein at least one of the two dummy gates is isolated from the fin by a split-oxide layer, and wherein the split-oxide layer comprises a thin and a thick oxide layer portions.

9. A method for providing an anti-fuse device for fin field-effect transistor (finFET) technology, the method comprising:
    forming a dummy gate over an end-corner of a fin;
    disposing an electrically conductive contact on a portion of the dummy gate and configuring the electrically conductive contact to be used as a first electrode of the anti-fuse device; and
    disposing a diffusion contact over the fin and configuring the diffusion contact to be used as a second electrode of the anti-fuse device.

10. The method of claim 9, further comprising forming the dummy gate such that the dummy gate partially extends out of the end-corner of the fin, and wherein the fin comprises a fin of an already existing finFET.

11. The method of claim 9, further comprising forming a thin oxide layer to isolate the dummy gate from the fin, wherein the thin oxide layer comprises silicon dioxide.

12. The method of claim 11, further comprising configuring the thin oxide layer to breakdown in at least one point near the end-corner when a suitable voltage is applied between the first and the second electrodes of the anti-fuse device to program the anti-fuse device.

13. The method of claim 9, further comprising forming the diffusion contact on an epitaxial layer formed on the fin.

14. The method of claim 9, further comprising forming a thick oxide layer to isolate the dummy gate from the fin, wherein the thick oxide layer comprises silicon dioxide.

15. The method of claim 9, further comprising forming two dummy gates over end-corners of the fin, and isolating a first one of the two dummy gates from the fin by a thin oxide layer and isolating the second one of the two dummy gates from the fin by a thick oxide layer.

16. The method of claim 15, further comprising isolating at least one of the two dummy gates from the fin by a split-oxide layer, and wherein the split-oxide layer comprises a thin and a thick oxide layer portions.

17. A communication device, comprising:
    a memory device comprising:
    one-time programmable (OTP) memory including an anti-fuse device compatible with fin field-effect transistor (finFET) technology comprising:
        a dummy gate formed over an end-corner of a fin;
        an electrically conductive contact disposed on a portion of the dummy gate and configured to be used as a first electrode of the device; and
        a diffusion contact disposed over the fin and configured to be used as a second electrode of the device.

18. The communication device of claim 17, wherein the dummy gate is isolated from the fin by a thin oxide layer, wherein the thin oxide layer comprises silicon dioxide, and wherein the thin oxide layer is configured to breakdown in at least one point near the end-corner when a suitable voltage is applied between the first and the second electrodes of the device to program the device.

19. The communication device of claim 17, wherein the diffusion contact is formed on an epitaxial layer formed on the fin, wherein the dummy gate is isolated from the fin by a thick oxide layer, and wherein the thick oxide layer comprises silicon dioxide.

20. The communication device of claim 17, wherein two dummy gates are formed over end-corners of the fin, wherein a first one of the two dummy gates is isolated from the fin by a thin oxide layer and the second one of the two dummy gates is isolated from the fin by a thick oxide layer, and wherein at least one of the two dummy gates is isolated from the fin of by a split-oxide layer, and wherein the split-oxide layer comprises a thin and a thick oxide layer portions.

* * * * *